US010097179B2

(12) United States Patent
Yang et al.

(10) Patent No.: US 10,097,179 B2
(45) Date of Patent: Oct. 9, 2018

(54) MIXING MODULE AND CAPACITIVE TOUCH PANEL

(71) Applicant: SHENZHEN GOODIX TECHNOLOGY CO., LTD., Shenzhen (CN)

(72) Inventors: Fu-Chiang Yang, Shenzhen (CN); Yingsi Liang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/657,069

(22) Filed: Jul. 21, 2017

(65) Prior Publication Data

US 2017/0324408 A1 Nov. 9, 2017

Related U.S. Application Data

(63) Continuation of application No. PCT/CN2016/089359, filed on Jul. 8, 2016.

(30) Foreign Application Priority Data

Dec. 21, 2015 (CN) .......................... 2015 1 0967581

(51) Int. Cl.
*H03K 17/96* (2006.01)
*H03D 7/16* (2006.01)
*H04B 1/10* (2006.01)

(52) U.S. Cl.
CPC ............. *H03K 17/962* (2013.01); *H03D 7/16* (2013.01); *H04B 1/10* (2013.01); *H03D 2200/0066* (2013.01)

(58) Field of Classification Search
CPC . H03K 17/962; H04B 1/10; H03D 2200/0066
See application file for complete search history.

(56) References Cited

U.S. PATENT DOCUMENTS

| 5,648,736 A * | 7/1997 | Ishigaki | ................ | H03B 21/00 327/105 |
| 6,662,001 B1 * | 12/2003 | Roth | ...................... | G01R 23/16 455/314 |

(Continued)

FOREIGN PATENT DOCUMENTS

| CN | 1538648 A | 10/2004 |
| CN | 101312350 A | 11/2008 |
| EP | 2148432 A1 | 1/2010 |

OTHER PUBLICATIONS

Smith, Jack R., translated by Jianqing Pang et al., Chapter 12 of "Modulators and Demodulators"—Modern Communication Circuits, 2nd edition[M], Jan. 31, 2006, p. 305-308, Figure 12.3.

(Continued)

*Primary Examiner* — Jung Kim

(57) ABSTRACT

A mixing module (40) comprises a switching mixer (400), controlled by a switch signal and configured to receive an inputting signal and generate an outputting signal; a modulating unit (402), coupled to the switching mixer (400) and configured to generate the switch signal; wherein a switching frequency of the switch signal is higher than an and is a specific multiple of inputting frequency of the inputting signal. The mixing module (40) controls the switching mixer (400) by using the switch signal which is much higher than the inputting frequency of the inputting signal; oversampling is performed on the inputting signal, so that the spectrum energy of the outputting signal is more concentrated, which can avoid the additional noise due to the introduction of sidelobes or harmonics.

15 Claims, 4 Drawing Sheets

(56) References Cited

U.S. PATENT DOCUMENTS

| | | |
|---|---|---|
| 2003/0139162 A1 | 7/2003 | Anand et al. |
| 2004/0152437 A1 | 8/2004 | Behzad |
| 2004/0169773 A1 | 9/2004 | Johnson |
| 2004/0208267 A1 | 10/2004 | Lee |
| 2005/0009491 A1 | 1/2005 | Anand |
| 2006/0073800 A1 | 4/2006 | Johnson et al. |
| 2006/0256216 A1 | 11/2006 | Takahiko et al. |
| 2007/0054648 A1* | 3/2007 | Pullela ............. H03D 7/1441 455/323 |
| 2007/0243848 A1 | 10/2007 | Behzad |
| 2008/0291992 A1 | 11/2008 | Tsuie et al. |
| 2009/0036069 A1 | 2/2009 | Seckin et al. |
| 2010/0029234 A1 | 2/2010 | Joos et al. |
| 2015/0016497 A1 | 1/2015 | Aziz et al. |

OTHER PUBLICATIONS

Search Report for EP Application No. 16877272.1, Applicant: Shenzhen Goodix Technology Co., Ltd., dated Jan. 31, 2018, 8 pages.

P. A. Nielsen et al: "Double Modulation Scheme for Switching Mixers Controlled by Sigma-Delta modulators" 1998 IEEE International Conference on Electronics, Circuits and Systems, Sep. 1998, pp. 363-366.

P. M. Aziz et al: "An Overview of Sigma-Delta Converters" IEEE Signal Processing Magazine, vol. 13, No. 1, Jan. 1996, pp. 61-84.

* cited by examiner

MIXING MODULE AND CAPACITIVE TOUCH PANEL

The present application is a continuation of international application No. PCT/CN2016/089359, filed on Jul. 8, 2016, which claims the priority to Chinese Patent Application No. 201510967581.0, filed on Dec. 21, 2015, and entitled "MIXING MODULE", both of which are hereby incorporated by reference in their entireties.

TECHNICAL FIELD

The present disclosure relates to the field of electronic technologies, and in particular, to a mixing module for improving a signal to noise ratio.

BACKGROUND

Mixer is widely applied in a communications system and capacitive touch system, and is configured to convert a high frequency received signal into a baseband signal, to facilitate further processing of the signal by a backend signal processing module. In general, the mixer implemented as a multiplier can generate a result of multiplying a received signal by a local signal. In addition, the mixer can be implemented by using a switching mixer, and the switching mixer has the advantages of high linearity, low noise and the like, and the switching mixer is controlled by a switch signal, wherein the switch signal has a switching frequency.

In the related art, in order to convert the high frequency received signal into the baseband signal, a switching frequency of the switch signal is generally the same as the frequency of the received signal. As such, the switching mixer can be equivalent to multiplying the received signal by a square wave having the same frequency as the received signal, and the square wave is the local signal. However, the square wave has relatively high sidelobes over the spectrum and harmonics at multiple frequency points, and the sidelobes and harmonics of the square ware would introduce additional noises, thereby reducing the signal to noise ratio (SNR) of the communications system or capacitive touch system.

SUMMARY

According to one aspect of the present disclosure, providing a mixing module, the mixing module includes:

a switching mixer, controlled by a switch signal, and configured to receive an inputting signal and generate an outputting signal; and a modulating unit, coupled to the switching mixer, and configured to generate the switch signal, a switching frequency of the switch signal is higher than and is a multiple of an inputting frequency of the inputting signal.

According to another aspect of the present disclosure, providing a capacitive touch panel including the mixing module.

The mixing module of the embodiment of the present disclosure controls the switching mixer by using the switch signal which is much higher than the inputting frequency of the inputting signal; and oversampling is performed on the inputting signal, so that spectrum energy of an outputting signal is more concentrated, which can avoid an additional noise due to the introduction of sidelobes or harmonics.

DESCRIPTION OF EMBODIMENTS

In order to make objectives, technical solutions and advantages of the present disclosure clearer, a further detailed description on the present disclosure will be given below with reference to the accompanying drawings and embodiments. It should be understood that, the specific embodiments described herein are merely used for illustrating the present disclosure, rather than limiting the present disclosure.

A mixing module of the embodiments of the present disclosure controls a switching mixer by using a switch signal which is much higher than an inputting frequency of an inputting signal; oversampling is performed on an inputting signal, so that spectrum energy of the outputting signal is more concentrated, which can avoid an additional noise due to the introduction of sidelobes or harmonics.

Figure 1:
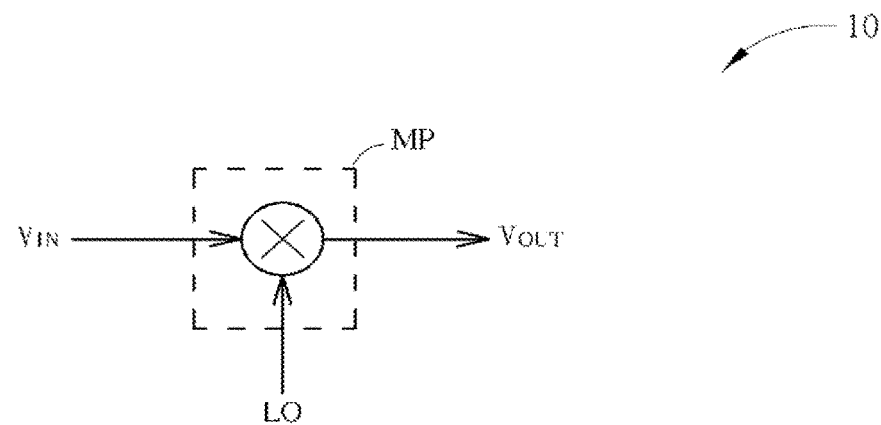
FIG. 1 is a schematic diagram of a mixer provided by an embodiment of the present disclosure.
Figure 2:
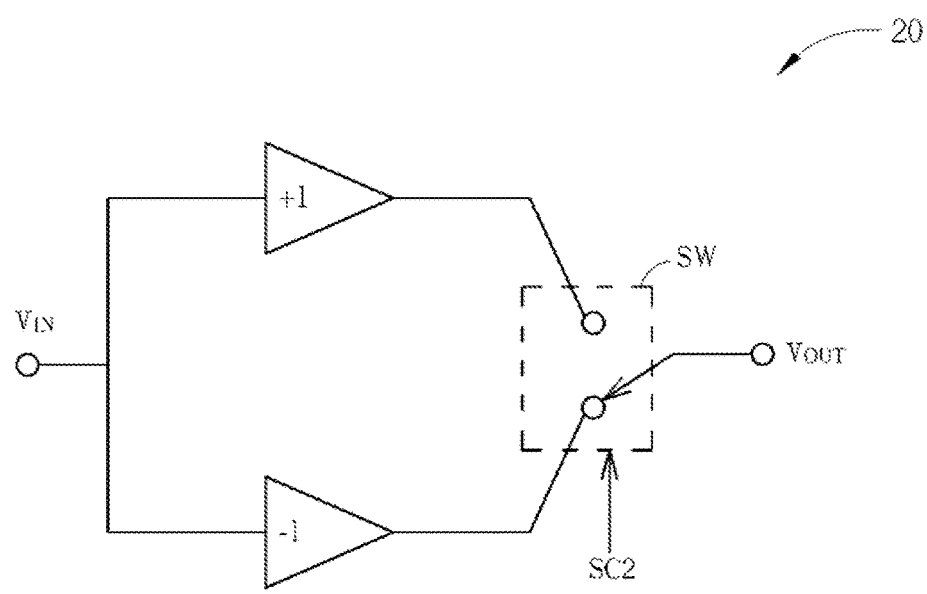
FIG. 2 is a schematic diagram of a switching mixer provided by an embodiment of the present disclosure.

As shown in FIGS. 1 and 2, FIG. 1 is a schematic diagram of a mixer 10, and FIG. 2 is a schematic diagram of a switching mixer 20. As shown in FIG. 1, the mixer 10 includes a multiplier MP configured to multiply an inputting signal $V_{IN}$ by a local signal LO, to generate an outputting signal $V_{OUT}$, that is, the outputting signal $V_{OUT}$ is a result of multiplying the inputting signal $V_{IN}$ by the local signal LO. In particular, the mixer 10 can be implemented by the switching mixer 20. As shown in FIG. 2, the switching mixer 20 includes a positive buffer (denoted as ⌈+1⌋), a negative buffer (denoted as ⌈−1⌋) and a switch unit SW. A positive inputting end of the positive buffer and a negative inputting end of the negative buffer are configured to receive the inputting signal $V_{IN}$, the switch unit SW is coupled to a positive outputting end of the positive buffer and a negative outputting end of the negative buffer, and is controlled by a switch signal SC2, to switch between the positive outputting end and the negative outputting end, and the switch unit SW outputs the outputting signal $V_{OUT}$. As a preferred embodiment, the switch signal SC2 has two different signal values. For example, the switch signal SC2 can be a logic 1 or a logic 0, or a signal value of the switch signal SC2 is an A or −A signal.

Figure 3:
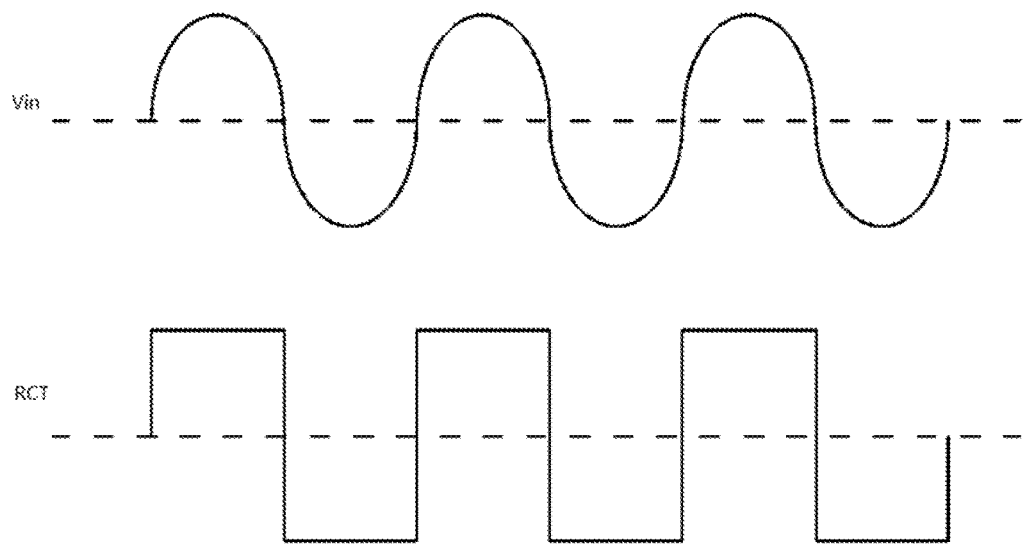
FIG. 3 is a waveform diagram of an inputting signal and a square wave signal provided by an embodiment of the present disclosure.

In this way, the switching mixer 20 is equivalent to multiplying the inputting signal $V_{IN}$ by a square wave. Referring to FIG. 3, FIG. 3 is a waveform diagram of the inputting signal $V_{IN}$ and a square wave signal RCT. The outputting signal $V_{OUT}$ of the switching mixer 20 can be regarded as the result of multiplying the inputting signal $V_{IN}$ by the square wave signal RCT. In other words, when the local signal LO is the square wave signal RCT, the switching mixer 20 can be configured to implement the mixer 10, to generate the result of multiplying the inputting signal $V_{IN}$ by the local signal LO (the square wave signal RCT). On the other hand, the inputting signal $V_{IN}$ has an inputting frequency $f_{IN}$, and in order to convert the inputting signal $V_{IN}$ into baseband, a frequency of the square signal RCT needs to be controlled to be the same as the inputting frequency $f_{IN}$. That is, a switching frequency of the switch signal SC2 is the same as the inputting frequency $f_{IN}$. However, such a square wave has problems of relatively high sidelobes and harmonics and the like over the spectrum, so that the signal to noise ratio (SNR) is relatively low.

Figure 4:
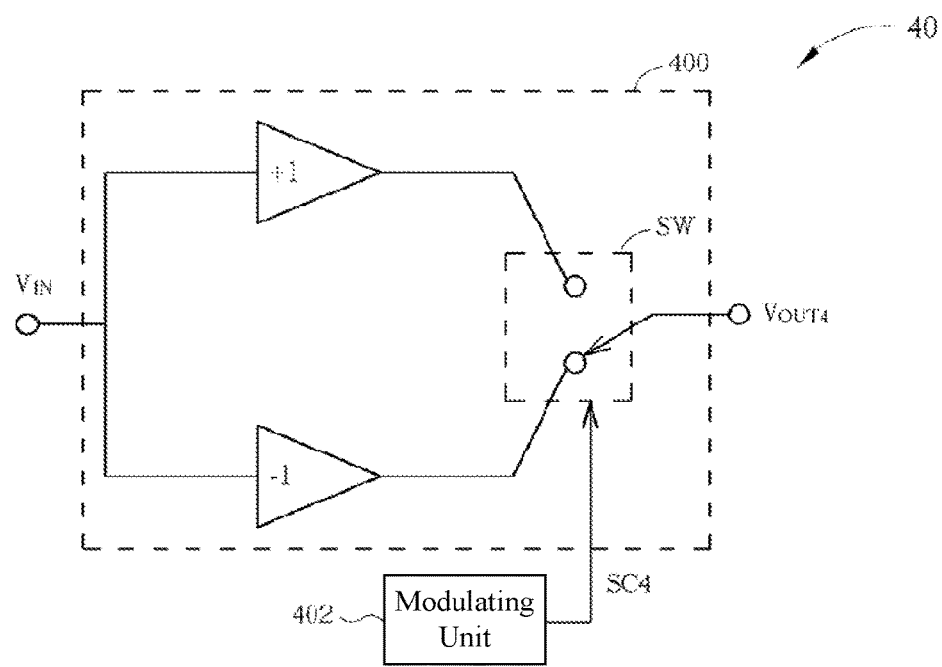
FIG. 4 is a schematic diagram of a mixing module provided by an embodiment of the present disclosure.

In order to improve the signal to noise ratio, the switch unit of the switching mixer is controlled by using the switch signal that has a higher frequency than the inputting signal $V_{IN}$ in the present disclosure. Referring to FIG. 4, FIG. 4 is a schematic diagram of a mixing module 40 according to an embodiment of the present disclosure. The mixing module 40 can be configured to a capacitive touch panel or communications system, and the mixing module 40 includes a switching mixer 400 and a modulating unit 402; the switching mixer 400 receives the inputting signal $V_{IN}$ and generates an outputting signal $V_{OUT4}$, and the modulating unit 402 is coupled to the switching mixer 400. The switching mixer 400 and the switching mixer 20 have the same circuit configuration, and therefore the same components are indicated as the same symbols and will not be described redundantly herein. It should be noted that the switch unit SW of the switching mixer 400 is controlled by a switch signal SC4 generated by the modulating unit 402. It should be noted that the switching frequency of the switch signal SC4 is much higher than the inputting signal $f_{IN}$ of the inputting signal $V_{IN}$. Preferably, the switching frequency of the switch signal SC4 is much higher than 10 times of the inputting frequency $f_{IN}$. As a result, the outputting signal $V_{OUT4}$ of the switching mixer 400 is a result of the inputting signal $V_{IN}$ after oversampling, spectrum energy is more concentrated, and the additional noise due to the introduction of the sidelobes and harmonics is avoided, thereby improving the signal to noise ratio.

Figure 5:
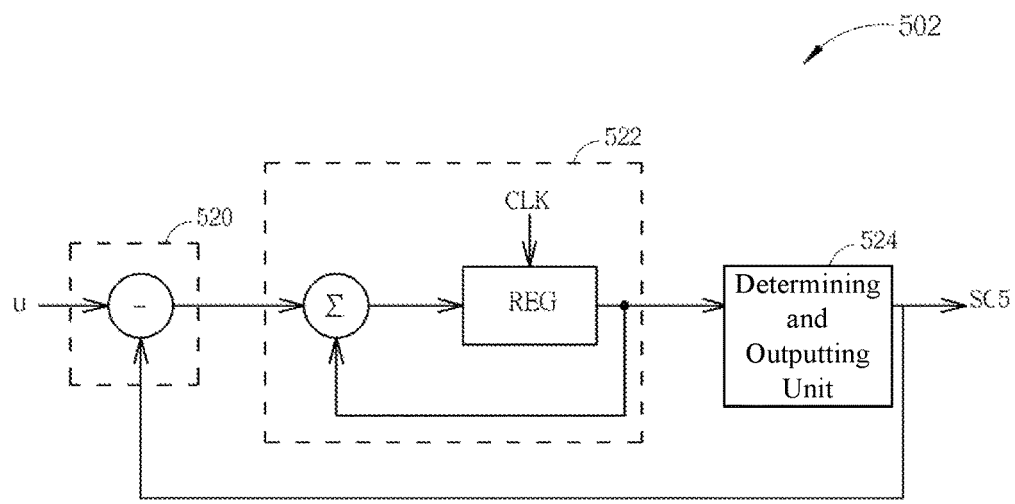
FIG. 5 is a schematic diagram of a Delta-Sigma modulator provided by an embodiment of the present disclosure.

In addition, in order to further improve the signal to noise ratio, the modulating unit of the mixing module 40 can be implemented by a Delta-Sigma modulator, and the Delta-Sigma modulator has a noise shaping effect and can push noise energy to a high frequency, thereby reducing noise energy at baseband, to further improve the signal to noise ratio. Referring to FIG. 5, FIG. 5 is a schematic diagram of a Delta-Sigma modulator 502. The Delta-Sigma modulator 502 receives a modulation inputting signal u and generates a switch signal SC5, and the switch signal SC5 can be configured to control the switch unit SW of the switching mixer 400. The Delta-Sigma modulator 502 includes a subtracting unit 520, a summing unit 522 and a determining and outputting unit 524. The subtracting unit 520 receives the modulation inputting signal u and is coupled to the determining and outputting unit 524 to receive the switch signal SC5, in order to generate a subtracting signal, which is a subtraction result of the modulation inputting signal u and the switch signal SC5. As a preferred embodiment of the present disclosure, the summing unit 522 includes an adding unit (denoted as [Σ]) and a caching unit REG controlled by a clock signal CLK, which is related to a switching frequency of the switch signal SC5 so that the switching frequency of the switch signal SC5 is much higher than the inputting frequency $f_{IN}$ of the inputting signal $V_{IN}$.

Figure 6:
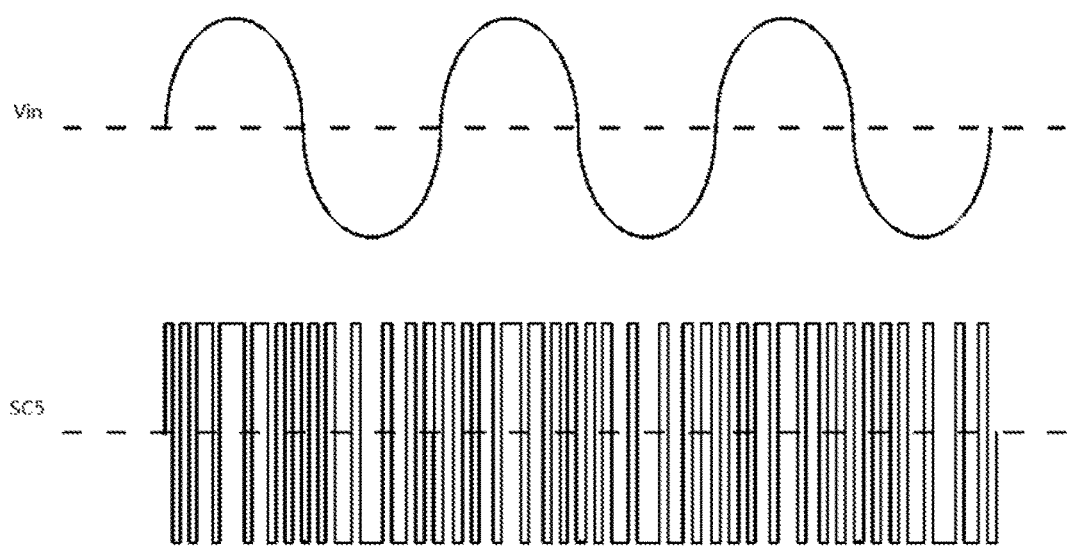
FIG. 6 is a waveform diagram of a switch signal provided by an embodiment of the present disclosure.

In one embodiment, the determining and outputting unit 524 is a 2-level quantizer and can output the switch signal SC5 of two different signal values, that is, the signal values of the switch signal SC5 are A or −A. The waveform diagram of the switch signal SC5 can refer to FIG. 6. The switch signal SC5 can control the switch unit SW of the switching mixer 400 to switch between the positive outputting end and the negative outputting end.

Figure 7:
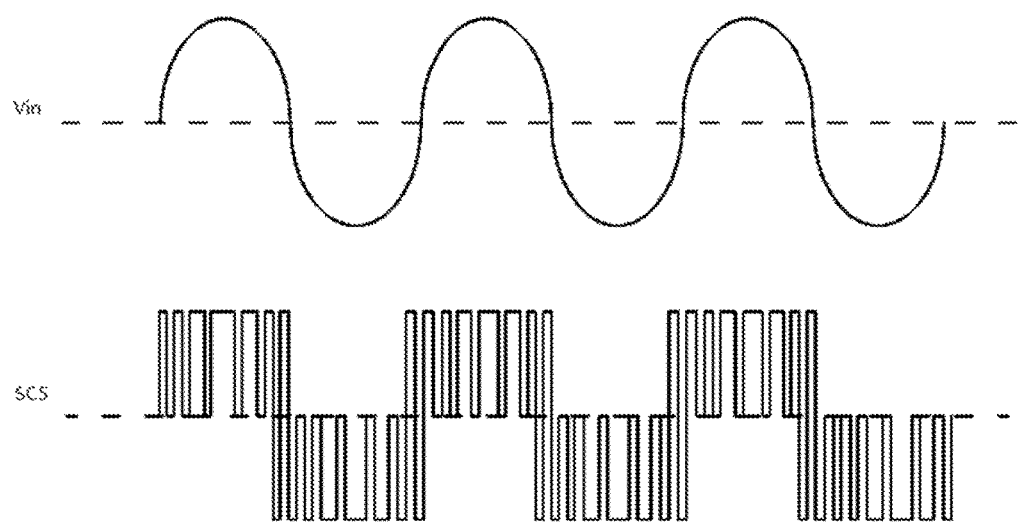
FIG. 7 is a waveform diagram of another switch signal provided by an embodiment of the present disclosure.

On the other hand, in one embodiment, the determining and outputting unit 524 is a 3-level quantizer and can output the switch signal SC5 of three different signal values, that is, the signal values of the switch signal SC5 can be A, −A or 0. The waveform diagram of the switch signal SC5 can refer to FIG. 7. The switch signal SC5 can control the switch unit SW of the switch mixer 400 to switch between the positive outputting end and the negative outputting end, when the signal value of the switch signal SC5 is A or −A; the switch signal SC5 can control the switch unit SW of the switching mixer 400 to be float-connected, that is, neither connected to the positive outputting end nor connected to the negative outputting end, when the signal value of the switch signal SC5 is 0.

In addition, in order to further suppress the sidelobes or harmonics, the modulation inputting signal u received by the Delta-Sigma modulator 502 can be proportional to the result of multiplying a periodic signal (for example, a sine wave, a cosine wave, a square wave or a triangle wave) by a window function, wherein the window function can be selected from a square window, a triangle window, a Hann window, a Hamming window, a Blackman window, a cosine window or a Gaussian window according to actual requirements, but is not limited hereto.

It can be seen from the foregoing that the mixing module of the embodiment of the present disclosure generates the switch signal whose switching frequency is much higher than the inputting frequency of the inputting signal by using the modulating unit to control the switch unit of the switching mixer, so that the spectrum energy of the outputting signal is more concentrated, thereby avoiding the additional noise due to the introduction of the sidelobe or harmonic. Furthermore, the high frequency switch signal after the noise shaping is generated by using the Delta-Sigma modulator, thereby further improving the signal to noise ratio.

It should be noted that the foregoing embodiment are merely illustrative concepts of the present disclosure and a person skilled in the art can make various modifications thereto, but is not limited hereto. For example, the Delta-Sigma modulator 502 is a first order Delta-Sigma modulator and can also be a second order, third order or higher order Delta-Sigma modulator, and all of them belong to the scope of the present disclosure. In addition, the Delta-Sigma modulator can receive analog or digital modulation inputting signal, and can also generate analog or digital switch signal and the summing unit of the delta-sigma modulator can be implemented as an integrator depending on situations, which also belongs to the scope of the present disclosure. In addition, the Delta-Sigma modulator can include an analog to digital converter (ADC) or a digital to analog converter (DAC) depending on situations, which also belongs to the scope of the present disclosure.

To sum up, the mixing module of the embodiment of the present disclosure controls the switching mixer by using the switch signal which is much higher than the inputting frequency of the inputting signal; oversampling is performed on the inputting signal, so that the spectrum energy of the outputting signal is more concentrated, thereby avoiding the additional noise due to the introduction of the sidelobes or harmonics. Furthermore, the high frequency switch signal after the noise shaping is generated by using the Delta-Sigma modulator, thereby further improving the signal to noise ratio.

Described above is merely a preferred embodiment of the present disclosure, rather than limiting the present disclosure, and any modifications, equivalent substitutions, improvements and the like, made within the spirit and principle of the present disclosure, should be all encompassed in the protection scope of the present disclosure.

What is claimed is:

1. A mixing module, comprising:
   a switching mixer, controlled by a switch signal, and configured to receive an inputting signal and generate an outputting signal; and
   a modulating unit, coupled to the switching mixer, and configured to generate the switch signal;
   wherein a switching frequency of the switch signal is higher than an inputting frequency of the inputting signal and is a multiple of the inputting frequency of the inputting signal,
   wherein the modulating unit is a Delta-Sigma modulator comprising:
   a subtracting unit, configured to generate a subtracting signal according to a modulation inputting signal and the switch signal;
   a summing unit, coupled to the subtracting unit, configured to receive the subtracting unit and generate a summing signal; and
   a determining and outputting unit, coupled to the summing unit and the subtracting unit and configured to output the switch signal.

2. The mixing module according to claim 1, wherein the summing unit comprises an adding unit and a caching unit, and wherein:
   the adding unit is coupled to an outputting end of the subtracting unit and the caching unit;
   an outputting end of the caching unit is coupled to the adding unit and the determining and outputting unit, and is controlled by a clock signal, and a frequency of the clock signal is related to the switching frequency of the switch signal.

3. The mixing module according to claim 1, wherein the modulation inputting signal is related to a window function.

4. The mixing module according to claim 3, wherein the window function is one of a square window, a triangle window, a Hann window, a Hamming window, a Blackman window, a cosine window or a Gaussian window.

5. The mixing module according to claim 3, wherein the modulation inputting signal is related to a result of multiplying a periodic signal by the window function.

6. The mixing module according to claim 5, wherein the periodic signal is one of a sine wave, a cosine wave, a square wave, or a triangle wave.

7. The mixing module according to claim 1, wherein the switch signal is a signal having two different signal values.

8. The mixing module according to claim 1, wherein the switching frequency is greater than or equal to 10 times of the inputting frequency.

9. A capacitive touch panel, comprising a mixing module, wherein the mixing module comprises:
   a switching mixer, controlled by a switch signal, and configured to receive an inputting signal and generate an outputting signal; and
   a modulating unit, coupled to the switching mixer, and configured to generate the switch signal;
   wherein a switching frequency of the switch signal is higher than an inputting frequency of the inputting signal and is a multiple of the inputting frequency of the inputting signal,
   wherein the modulating unit is a Delta-Sigma modulator comprising:
   a subtracting unit, configured to generate a subtracting signal according to a modulation inputting signal and the switch signal;
   a summing unit, coupled to the subtracting unit, configured to receive the subtracting unit and generate a summing signal; and
   a determining and outputting unit, coupled to the summing unit and the subtracting unit and configured to output the switch signal.

10. The capacitive touch panel according to claim 9, wherein the summing unit comprises an adding unit and a caching unit, and wherein:
    the adding unit is coupled to an outputting end of the subtracting unit and the caching unit;
    an outputting end of the caching unit is coupled to the adding unit and the determining and outputting unit, and is controlled by a clock signal, and a frequency of the clock signal is related to the switching frequency of the switch signal.

11. The capacitive touch panel according to claim 9, wherein the modulation inputting signal is related to a window function.

12. The capacitive touch panel according to claim 11, wherein the window function is one of a square window, a triangle window, a Hann window, a Hamming window, a Blackman window, a cosine window or a Gaussian window.

13. The capacitive touch panel according to claim 11, wherein the modulation inputting signal is related to a result of multiplying a periodic signal by the window function.

14. The capacitive touch panel according to claim 13, wherein the periodic signal is one of a sine wave, a cosine wave, a square wave, or a triangle wave.

15. The mixing module according to claim 9, wherein the switching frequency is greater than or equal to 10 times of the inputting frequency.

* * * * *